US012525427B2

(12) United States Patent
Ondřej et al.

(10) Patent No.: US 12,525,427 B2
(45) Date of Patent: Jan. 13, 2026

(54) TRANSMISSION CHARGED PARTICLE BEAM APPARATUS, AND METHOD OF ALIGNING SUCH A TRANSMISSION CHARGED PARTICLE BEAM APPARATUS

(71) Applicants: Shánĕl Ondřej, Brno (CZ); Jan Jisa, Trutnov (CZ); Ondřej Bačo, Brno (CZ); Martin Schneider, Suchohrdly (CZ)

(72) Inventors: Shánĕl Ondřej, Brno (CZ); Jan Jisa, Trutnov (CZ); Ondřej Bačo, Brno (CZ); Martin Schneider, Suchohrdly (CZ)

(73) Assignee: FEI Company, Hillsboro, OR (US)

( * ) Notice: Subject to any disclaimer, the term of this patent is extended or adjusted under 35 U.S.C. 154(b) by 442 days.

(21) Appl. No.: 18/086,628

(22) Filed: Dec. 21, 2022

(65) Prior Publication Data

US 2023/0282443 A1 Sep. 7, 2023

(51) Int. Cl.
*H01J 37/26* (2006.01)
*H01J 37/22* (2006.01)

(52) U.S. Cl.
CPC .......... *H01J 37/265* (2013.01); *H01J 37/226* (2013.01); *H01J 37/26* (2013.01); (Continued)

(58) Field of Classification Search
CPC ........ H01J 37/265; H01J 37/226; H01J 37/26; H01J 2237/0245; H01J 2237/24578; H01J 2237/2826
See application file for complete search history.

(56) References Cited

U.S. PATENT DOCUMENTS 6,531,697 B1 * 3/2003 Nakamura .......... H01J 37/1471 250/311
7,812,310 B2 10/2010 Tanaka et al.
(Continued)

FOREIGN PATENT DOCUMENTS

EP 2797100 A1 * 10/2014 ........... H01J 37/263
JP 4050948 9/2021
WO WO-2013151421 A2 * 10/2013 .............. H01J 37/22

OTHER PUBLICATIONS

EP Search Report for EP application 21217095, dated Aug. 10, 2022.

(Continued)

*Primary Examiner* — David E Smith

(57) ABSTRACT

The invention relates to Transmission Charged Particle Beam (TCPB) apparatus comprising a sample holder, for holding a sample, a source for producing a beam of charged particles and an illuminator for directing said beam so as to irradiate the sample; The TCPB apparatus comprises an imaging system, for receiving a flux of charged particles transmitted through the sample and directing it onto a sensing device. Further, a controller is provided for controlling at least some operational aspects of the TCPB apparatus. As defined herein, the controller is arranged for receiving calibration data of said TCPB apparatus and using said calibration data for optically aligning said TCPB apparatus. Said calibration data may be obtained in a calibration session, wherein different settings for eucentric focus can be used as a measure of eucentric height, so that the TCPB apparatus can be optically aligned in absence of a sample on the sample holder.

13 Claims, 3 Drawing Sheets

(52) U.S. Cl.
CPC .................. *H01J 2237/0245* (2013.01); *H01J 2237/24578* (2013.01); *H01J 2237/2826* (2013.01)

(56) References Cited

U.S. PATENT DOCUMENTS

| | | | | |
|---|---|---|---|---|
| 8,692,196 | B2 | 4/2014 | Tiemeijer et al. | |
| 10,224,174 | B1 | 3/2019 | Freitag et al. | |
| 11,133,151 | B2 | 9/2021 | Iijima et al. | |
| 2011/0049363 | A1 * | 3/2011 | Koch ............... | G01N 23/20058 250/397 |
| 2016/0013016 | A1 * | 1/2016 | Otten ...................... | H01J 37/20 250/311 |

OTHER PUBLICATIONS

Fang G Y et al: Stereoscopy by Tilted Illumination in Transmission Electron Microscopy, Ultramicroscopy, Elsevier, Amsterdam, NL, vol. 55, No. 2, Aug. 1, 1994.

* cited by examiner

TRANSMISSION CHARGED PARTICLE BEAM APPARATUS, AND METHOD OF ALIGNING SUCH A TRANSMISSION CHARGED PARTICLE BEAM APPARATUS

FIELD OF THE INVENTION

The invention relates to a transmission charged particle beam apparatus, and a method of aligning such a transmission charged particle beam apparatus.

BACKGROUND OF THE INVENTION

The charged particle beam apparatus may in principle be any apparatus that uses charged particles, such as electrons, protons and/or ions, for generating a beam that is used, for example, to illuminate an object of interest. The charged particle beam may be used for studying a sample or inspecting an object. Applications include, for example, Transmission Electron Microscopy and Scanning Transmission Electron Microscopy.

In many of these charged particle beam apparatuses, an alignment of the charged particle beam is necessary. For example, in Transmission Electron Microscopy (TEM) the electron beam needs to be focussed such that the object of interested is illuminated with a parallel beam, and then the transmitted beam is focused onto a detector. In Scanning Transmission Electron Microscopy, the electron beam is focussed into a small point onto the object, and the beam is scanned over the object and resulting secondary electrons, scattered beam electrons, characteristic X-rays, and/or electron energy loss can be detected for examining the object of interest. For achieving high quality results, alignment of the charged particle beam apparatus is required.

SUMMARY

In one example, a Transmission Charged Particle Beam (TCPB) apparatus comprises a sample holder, for holding a sample; a source for producing a beam of charged particles; an illuminator for directing said beam so as to irradiate the sample; an imaging system, for receiving a flux of charged particles transmitted through the sample and directing it onto a sensing device; and a controller, for controlling at least some operational aspects of the TCPB apparatus; characterized in that the controller is arranged for receiving calibration data of said TCPB apparatus and using said calibration data for optically aligning said TCPB apparatus.

In another example, a method of aligning a Transmission Charged Particle Beam (TCPB) apparatus comprises the steps of: providing calibration data related to said TCPB apparatus; and using said calibration data for optically aligning the TCPB apparatus

DETAILED DESCRIPTION

Figure 1:
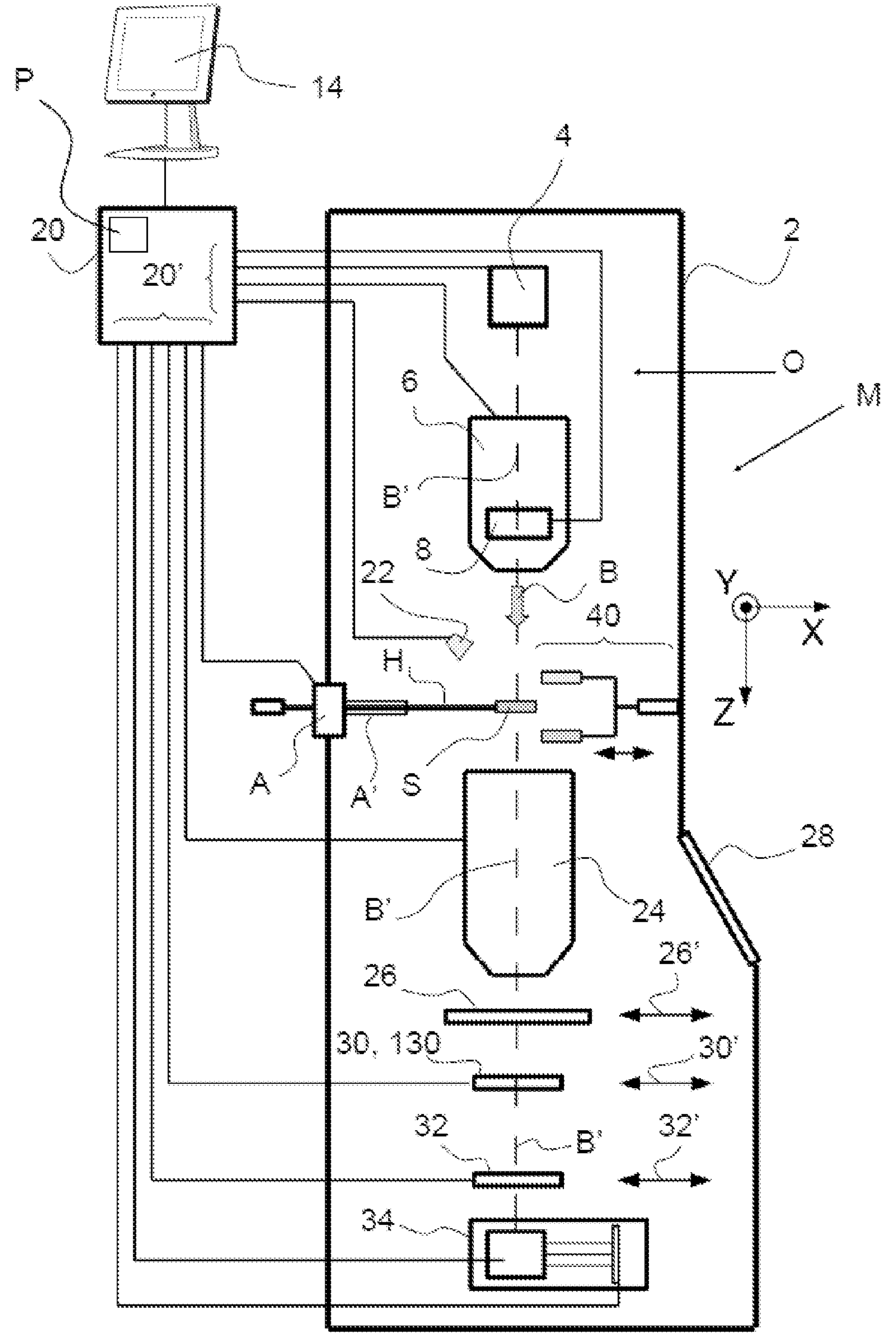
FIG. 1—shows a longitudinal cross-sectional view of a charged particle microscope according to a first embodiment of the invention.

Alignment of a charged particle beam apparatus has proven to be very difficult and requires a high level of expertise from an operator to be achieved in a quick and reliable manner. For example, in a TEM, the alignment involves one or more of the following parameters and operations: setting the beam source and choosing illuminator settings, choosing the sample height (eucentric height), getting the beam shifts and tilts pivoting correctly, getting the beam projective part of the column tilted accurately down the optical axis of objective lens (rotation centre, objective aperture, if required), and refine the focus of the diffraction lens, correct astigmatism for each lens appropriately at each point. Alignment in a TEM requires a special calibration sample and may require a couple of iterations to achieve a desired end result, which takes a lot of time and is prone to making mistakes.

To this end, it is an object of the invention to provide a method with which the alignment of the transmission charged particle beam apparatus is improved, in particular in terms of ease of use, accuracy and/or speed. It is furthermore an object of the invention to provide a transmission charged particle beam apparatus that has the above qualities.

To this end, the disclosure provides a Transmission Charged Particle Beam Apparatus comprises a sample holder, for holding a sample; a source for producing a beam of charged particles; an illuminator for directing said beam so as to irradiate the sample; an imaging system, for receiving a flux of charged particles transmitted through the sample and directing it onto a sensing device; and a controller, for controlling at least some operational aspects of the TCPB apparatus; characterized in that the controller is arranged for receiving calibration data of said TCPB apparatus and using said calibration data for optically aligning said TCPB apparatus.

By providing calibration data of the Transmission Charged Particle Beam (TCPB) apparatus, and using this calibration data for optically aligning said TCPB apparatus, it becomes possible to more quickly and more effectively align the charged particle beam apparatus, such as a transmission electron microscope.

According to an aspect, the calibration data of the TCPB apparatus can be acquired, and said calibration data can be stored for later use. The calibration data can be acquired by calibrating the TCPB apparatus for a range of input parameters. Thus, calibration can be done once, for example in a factory after assembly of the TCPB apparatus, or after installation of the TCPB apparatus, and the resulting calibration data can be used later during normal use of the TCPB apparatus, for research purposes, for example. The calibration data can be generated using a calibration sample. In an embodiment, the calibration data can be amended or updated, for example in a periodical manner. Because the TCPB apparatus is mechanically very stable, once the calibration data related to the operational aspects of the TCPB (which are controlled digitally/electronically) are generated, the same calibration data can be applied to different samples (or eucentric heights) for consistent alignment. All in all, this way of calibrating a TCPB apparatus saves a lot of time.

The calibration data can be based on one or more input parameters, so that the step of optically aligning said TCPB apparatus (i.e. setting one or more output parameters, such as settings for the illuminator of the TCPB apparatus) can be based on these one or more input parameters. This way, alignment of the TCPB apparatus can be done quickly and easily, based on certain initial settings of the TCPB apparatus.

With this, alignment of the TCPB apparatus is improved, in particular in terms of ease of use, accuracy and speed. With this, the object of the invention is achieved.

Advantageous embodiments of the disclosure will be described below.

In an embodiment, said controller is arranged for optically aligning the TCPB apparatus in absence of a sample on the sample holder. By using the calibration data, it becomes possible to do various alignment steps without actually needing a calibration sample. Based on one or more input parameters, the controller is arranged for optically aligning the TCPB apparatus, so that no calibration sample is needed anymore.

In an embodiment, optically aligning said TCPB apparatus comprises controlling operational aspects of the illuminator. It is conceivable that the optical alignment by said controller, and based on said calibration data, may be used for controlling operational aspects of the illuminator alone. In other words, optically aligning said TCPB apparatus may consist of controlling operational aspects of the illuminator only.

In an embodiment, said controller is arranged for optically aligning the TCPB apparatus in absence of the sample on the sample holder by controlling operational aspects of the illuminator only.

In an embodiment, said calibration data is stored on a calibration data storage unit. The calibration data storage unit may be part of the TCPB apparatus, so that TCPB apparatus comprises said calibration data storage unit. The calibration data storage unit may be connected to said controller, or may be a part thereof. In an embodiment, a measure for eucentric height is used as the input parameter for receiving said calibration data. In an embodiment, the measure for eucentric height is the only input parameter. The measure for eucentric height can be defined by eucentric focus, i.e. a value related to the excitation of the objective lens.

In the embodiment that uses a measure of eucentric height as the at least one input parameter, it is very convenient to establish the calibration data for different eucentric heights (such as different settings for eucentric focus, for example). Establishing the calibration data for the eucentric height can be done in a systematic manner, for a number of different settings for eucentric height (such as different settings for eucentric focus, for example), and resulting output parameters can be encoded in the calibration data. This way it will be easy to revert to previously calibrated settings of the TCPB apparatus, based on the chosen eucentric height in an experiment.

In an embodiment, said calibration data comprises one or more of the following: beam shift, beam tilt, source tilt, source shift, image rotation centre (for the projection system) and beam rotation centre (for the illumination system), and/or a combination thereof. The input parameter may also include a difference between the beam rotation centre and the image rotation centre, for example.

In an embodiment, eucentric height is used as the input parameter for receiving calibration data comprising, or consisting of at least one or more of the following: beam shift, beam tilt, source tilt, source shift, image rotation centre (for the projection system) and beam rotation centre (for the illumination system), and/or a combination thereof. The input parameter may also include a difference between the beam rotation centre and the image rotation centre, for example. The calibration data is then used for optically aligning said TCPB apparatus.

According to an aspect, the disclosure provides a method of aligning a Transmission Charged Particle Beam (TCPB) Apparatus. The method is characterized by the steps of providing calibration data related to said TCPB apparatus; and using said calibration data for optically aligning the TCPB apparatus As indicated before, the use of calibration data allows for more effective and quicker optical alignment of the TCPB apparatus.

Further embodiments of the method as defined herein will be elucidated below.

In an embodiment, the method comprises the step of optically aligning the TCPB apparatus in absence of a sample on the sample holder.

In an embodiment, the method comprises: after optical aligning the TCPB apparatus, loading a sample into the TCPB apparatus, and imaging or processing the loaded sample using the TCPB apparatus.

In an embodiment, the method comprises the step of optically aligning the TCPB apparatus by controlling operational aspects of the illuminator.

In an embodiment, the method comprises the step of using eucentric height as an input parameter for optically aligning said TCPB apparatus.

In an embodiment, optically aligning said TCPB apparatus comprises setting one or more parameters chosen from the group of: beam shift, beam tilt, source tilt, source shift, image rotation centre (for the projection system) and beam rotation centre (for the illumination system), and/or a combination thereof. The input parameter may also include a difference between the beam rotation centre and the image rotation centre, for example.

In an embodiment, the method comprises the step of selecting the eucentric height as an input parameter, and based on that input parameter retrieving beam shift, beam tilt, source tilt, source shift, image rotation centre (for the projection system) and beam rotation centre (for the illumination system), and/or a combination thereof, as calibration data and setting these parameters as output parameters on the TCPB apparatus. The input parameter may also include a difference between the beam rotation centre and the image rotation centre, for example. In an embodiment, firstly the source tilt and source shift are set, secondly the beam shift and beam tilt are set, and thirdly the beam rotation centre and image rotation centre are set.

Turning to FIG. 1, FIG. 1 (not to scale) is a highly schematic depiction of an embodiment of a charged-particle microscope M according to an embodiment of the invention. More specifically, it shows an embodiment of a transmission-type microscope M, which, in this case, is a TEM/STEM. In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a sample S (which may, for example, be (locally) thinned/planarized). Also depicted is a deflector 8, which (inter alia) can be used to effect scanning motion of the beam B.

The sample S is held on a sample holder H that can be positioned in multiple degrees of freedom by a positioning device/stage A, which moves a cradle A' into which holder H is (removably) affixed; for example, the sample holder H may comprise a finger that can be moved (inter alia) in the XY plane (see the depicted Cartesian coordinate system; typically, motion parallel to Z and tilt about X/Y will also be possible). Such movement allows different parts of the sample S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the sample holder H, so as to maintain it (and the sample S thereupon) at cryogenic temperatures, for example.

The electron beam B will interact with the sample S in such a manner as to cause various types of "stimulated" radiation to emanate from the sample S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the sample S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the sample S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

- TEM camera 30. At camera 30, the electron flux can form a static image (or diffractogram) that can be processed by controller/processor 20 and displayed on a display device 14, such as a flat panel display, for example. When not required, camera 30 can be retracted/withdrawn (as schematically indicated by arrows 30') so as to get it out of the way of axis B'.
- STEM camera 32. An output from camera 32 can be recorded as a function of (X,Y) scanning position of the beam B on the sample S, and an image can be constructed that is a "map" of output from camera 32 as a function of X,Y. Camera 32 can comprise a single pixel with a diameter of e.g. 20 mm, as opposed to the matrix of pixels characteristically present in camera 30, although camera 32 can be an Electron Microscope Pixel Array Detector (EMPAD) as well. Moreover, camera 32 will generally have a much higher acquisition rate (e.g. 106 points per second) than camera 30 (e.g. 102 images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).
- As an alternative to imaging using cameras 30 or 32, one can also invoke spectroscopic apparatus 34, which could be an EELS (Electron Energy-Loss Spectroscopy) module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the sample along different lines of sight, so as to acquire penetrative observations of the sample from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). The (schematically depicted) controller 20 may be (partially) inside or outside the enclosure 2, and may have a unitary or composite structure, as desired. The controller comprises, as shown in this embodiment, a data storage unit P.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, sample holder H, screen 26, camera 30, camera 32, spectroscopic apparatus 34, etc.

The charged-particle microscope M in FIG. 1 is an example of a Transmission Charged Particle Beam (TCPB) apparatus according to the invention, and generally comprises:

- A sample holder H, for holding a sample S;
- A source 4 for producing a beam B of charged particles;
- An illuminator 6 for directing said beam B so as to irradiate the sample S;
- An imaging system 24, for receiving a flux of charged particles B' transmitted through the sample S and directing it onto a sensing device 30, 32, 34; and
- A controller 20, for controlling at least some operational aspects of the TCPB apparatus.

The controller 20 of the transmission charged-particle microscope M as shown in FIG. 1 is arranged for receiving calibration data of said microscope M and using said calibration data for optically aligning said microscope M, which may include controlling settings of the illuminator 6, for example. In the embodiment shown in FIG. 1, the calibration data may be stored on data storage unit P, that is connected to (or part of) the controller 20. With the calibration data it is more easy to align the microscope M under different settings.

Figure 2:
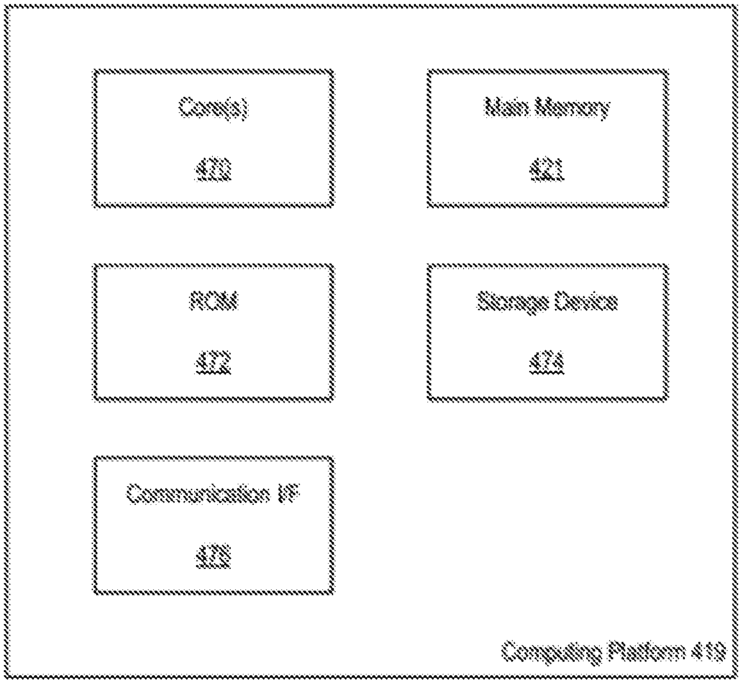
FIG. 2— A schematic block diagram of a computer system.

FIG. 2 is a block diagram that illustrates a computer system 419 upon which an embodiment of the invention may be implemented. The computing system 419 may be an example of the controller 20. Computer system 419 at least includes a bus or other communication mechanism for communicating information, and a hardware processor, e.g., cores, 470 coupled with the bus (not shown) for processing information. Hardware processor 470 may be, for example, a general purpose microprocessor. The computing system 419 may be used to implement the methods and techniques disclosed herein, and may also be used to obtain images and process said images with one or more filters/algorithms.

Computer system 419 also includes a main memory 421, such as a random access memory (RAM) or other dynamic storage device, coupled to the bus for storing information and instructions to be executed by processor 470. Main memory 421 also may be used for storing temporary variables or other intermediate information during execution of instructions to be executed by processor 470. Such instructions, when stored in non-transitory storage media accessible to processor 470, render computer system 419 into a special-purpose machine that is customized to perform the operations specified in the instructions.

Computer system 419 further includes a read only memory (ROM) 472 or other static storage device coupled to bus for storing static information and instructions for processor 470. A storage device 474, such as a magnetic disk or optical disk, is provided and coupled to a bus for storing information and instructions.

Computer system 419 may be coupled via the bus to a display, such as a cathode ray tube (CRT), for displaying information to a computer user, see display 14 in FIG. 1. An input device, including alphanumeric and other keys, is coupled to the bus for communicating information and command selections to processor 470. Another type of user input device is a cursor control, such as a mouse, a trackball, or cursor direction keys for communicating direction information and command selections to processor 470 and for controlling cursor movement on the display. This input device typically has two degrees of freedom in two axes, a first axis (e.g., x) and a second axis (e.g., y), that allows the device to specify positions in a plane.

Computer system 419 may implement the techniques described herein using customized hard-wired logic, one or more ASICs or FPGAs, firmware and/or program logic which in combination with the computer system causes or programs computer system 419 to be a special-purpose machine. According to one embodiment, the techniques herein are performed by computer system 419 in response to processor 470 executing one or more sequences of one or more instructions contained in main memory 421. Such instructions may be read into main memory 421 from another storage medium, such as storage device 474. Execution of the sequences of instructions contained in main memory 421 causes processor 470 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 474. Volatile media includes dynamic memory, such as main memory 421. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise the bus. Transmission media can also take the form of acoustic or light waves, such as those generated during radio-wave and infra-red data communications.

Computer system 419 also includes a communication interface 476 coupled to the bus. Communication interface 476 provides a two-way data communication coupling to a network link (not shown) that is connected to a local network, for example. As another example, communication interface 476 may be a local area network (LAN) card to provide a data communication connection to a compatible LAN. Wireless links may also be implemented. In any such implementation, communication interface 476 sends and receives electrical, electromagnetic or optical signals that carry digital data streams representing various types of information.

Computer system 419 can send messages and receive data, including program code, through the network(s), a network link and communication interface 476. In the Internet example, a server might transmit a requested code for an application program through Internet, ISP, local network and communication interface 476. The received code may be executed by processor 470 as it is received, and/or stored in storage device 474, or other non-volatile storage for later implementation.

Computer system 419 comprises, in an embodiment, calibration data, which may be part of the Main Memory 421, ROM 472 and/or Storage device 474, for example. The calibration data comprises data that enables the controller to optically align the transmission charged particle beam apparatus connected thereto, such as the Transmission Electron Microscope M as disclosed in FIG. 1.

Figure 3:
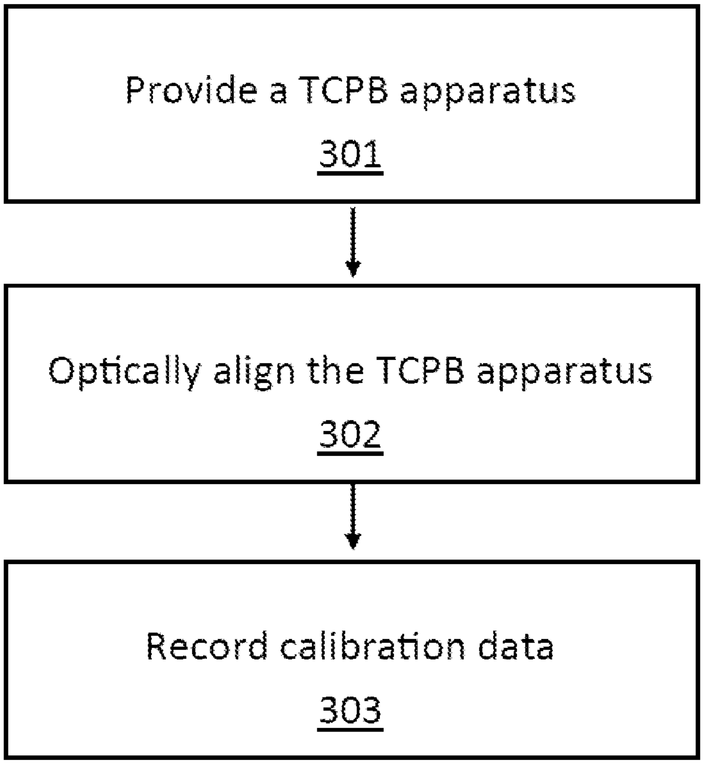
FIG. 3—a schematic overview of an embodiment of a method as described herein.

In particular, the calibration data enables the controller to optically align the TCPB apparatus in absence of a sample S on the sample holder H. In an embodiment, this is accomplished by the provision of calibration data that was obtained previously with respect to a TCPB apparatus that has been calibrated using a sample. Thus, as shown in FIG. 3, a method of providing the calibration data may comprise the steps of 301 providing a TCPB apparatus; 302 optically aligning said TCPB apparatus using a number of input parameters, wherein a sample is used; and 303 storing the relevant output parameters obtained in step 302 with appropriate input parameters as the calibration data. After this calibration method, the obtained calibration data can be used to optically align the TCPB apparatus based on the at least one input parameter, without the need for a sample.

Figure 4:
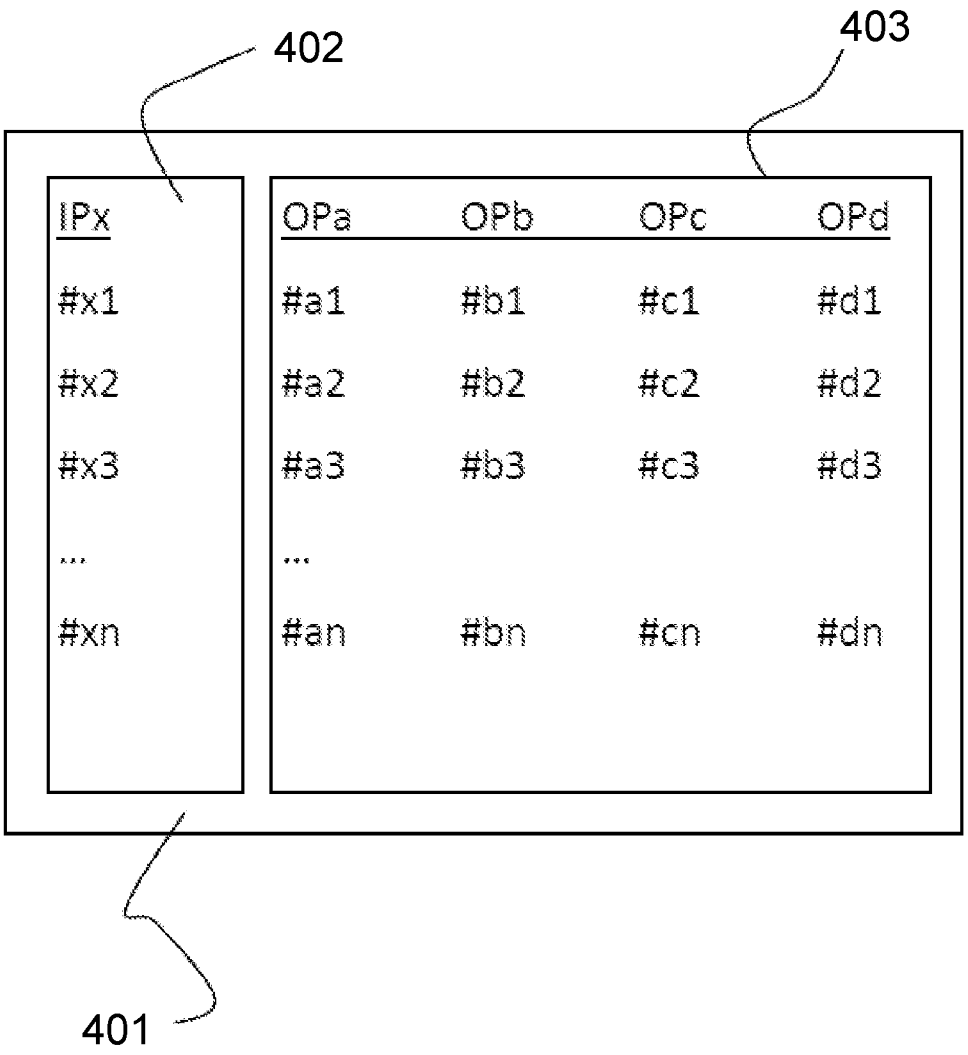
FIG. 4—a schematic overview of a matrix data structure containing calibration data as described herein.

As can be seen in FIG. 4, the calibration data 401 may include a matrix data structure, comprising a set of input parameters 402 and a set of output parameters 403. The matrix data structure 401 indicated here includes a single input parameter IPx, and a total of four output parameters OPa, OPb, OPc, OPd. The input parameter IPx contains a plurality of different value #x1, #x2, #x3, . . . , #xn. For each value of this input parameter IPx, a corresponding value for all output parameters is listed, which can be based, for example, on the calibration method as described with respect to FIG. 3. For example, when input parameter IPx has value #x2, the OPa has value #a2, OPb has value #b2, OPc has value #c2, and OPd has value #d2. Thus, when the TCPB apparatus has an input parameter IPx with a certain value, the calibration data is able to provide the corresponding values for output parameters OPa-OPd, and the controller is arranged for setting the relevant output parameters to the required value.

In an example, the input parameter IPx may be a single parameter, although it is conceivable that at least one further input parameter is used in the calibration data 401. As an example (not shown) an input parameter IPy may be present, wherein IPx may comprise values #x1-#xn at a value #y1 for IPy, IPx may comprise values #x1-#xn at a value #y2 for IPy, onto #x1-#xn at a value #ym for IPy. This may lead to a more lengthy calibration data table, having length n×m, wherein n may be equal to, or different from, m.

Instead of a calibration data table 401 as shown in FIG. 4, it is conceivable as well that the calibration data comprises one or more equations that has/have the input parameter as a variable for determining one or more corresponding output variables. As an example, the output parameter OPa can be a linear function of the input variable IPx: OPa=A*IPx+B. Other equations are of course conceivable, and the disclosure is not limited thereto. Different output parameters may have different equations. Different output parameters may also use different approaches, such as an equation for OPa, and a data lookup table for OPd, etcetera. The skilled person will, in light of this disclosure, be familiar with ways of providing the calibration data in a meaningful form.

In an embodiment, the input parameter IPx is related to eucentric height.

In an embodiment, the output parameters comprise one or more of the following: beam shift, beam tilt, source tilt, source shift, image rotation centre, and beam rotation centre, and/or a combination thereof. The input parameter may also include a difference between the beam rotation centre and the image rotation centre, for example.

In an embodiment, the input parameter IPx is the eucentric height, and the set of output parameters 403 consists of a total of six parameters, namely: beam shift, beam tilt, source tilt, source shift, image rotation centre and beam rotation centre. Using a data table format as shown in FIG. 4, it will be relatively easy to use a value for the eucentric height as an input parameter, and readout the corresponding output parameters, that were determined, for example, using the calibration method as shown in FIG. 3.

Based on the eucentric height as an input parameter, the controller may be arranged for setting the beam shift and beam tilt first, then the source tilt and source shift, and finally the beam rotation centre.

Embodiments of the invention have been disclosed above. The method has been described with respect to a transmission charged particle microscope, and can be applied to a scanning transmission charged particle microscope as well. Examples include a Transmission Electron Microscope and a Scanning Transmission Electron Microscope. Generally, the invention can be applied to any Charged Particle Beam Apparatus, including non-Transmission Charged Particle Beam Apparatuses. The applicant reserves the right to file further patent applications, such as a divisional patent application, to one or more of these mentioned apparatuses. The desired protection is conferred by the appended claims.

The invention claimed is:

1. A Transmission Charged Particle Beam (TCPB) apparatus comprising:

A sample holder, for holding a sample;

A source for producing a beam of charged particles;

An illuminator for directing said beam so as to irradiate the sample;

An imaging system, for receiving a flux of charged particles transmitted through the sample and directing it onto a sensing device; and A controller arranged for receiving calibration data of said TCPB apparatus using a measure for eucentric height as an input parameter and using said calibration data for optically aligning said TCPB apparatus, wherein said calibration data comprise one or more of the following: beam shift, beam tilt, source tilt, source shift, astigmatism, and beam rotation centre, image rotation centre, and/or combinations thereof, and wherein optically aligning said TCPB apparatus comprises setting one or more parameters chosen from the group of: beam shift, beam tilt, source tilt, source shift, image rotation centre and beam rotation centre, and/or a combination thereof.

2. TCPB apparatus according to claim 1, wherein said controller is arranged for optically aligning the TCPB apparatus in absence of a sample on the sample holder.

3. TCPB apparatus according to claim 1, wherein optically aligning said TCPB apparatus comprises controlling operational aspects of the illuminator.

4. TCPB apparatus according to claim 2, wherein said controller is arranged for optically aligning the TCPB apparatus in absence of the sample on the sample holder by controlling operational aspects of the illuminator only.

5. TCPB apparatus according to claim 1, further comprising a calibration data storage unit and the controller is further arranged for storing the calibration data on the calibration data storage unit.

6. TCPB apparatus according to claim 1, wherein the calibration data is generated using a calibration sample.

7. TCPB apparatus according to claim 1, wherein said measure for eucentric height is defined by an eucentric focus.

8. A method of aligning a Transmission Charged Particle Beam (TCPB) apparatus, wherein said TCPB apparatus comprises:

A sample holder, for holding a sample;

A source for producing a beam of charged particles;

An illuminator for directing said beam so as to irradiate the sample; and

An imaging system, for receiving a flux of charged particles transmitted through the sample and directing it onto a sensing device;

Characterized by the steps of:

using a measure for excentric height as an input er for receiving calibration data, wherein said calibration data comprises one or more of the following: beam shift, beam tilt, source tilt, source shift, astigmatism, and beam rotation centre, image rotation centre, and/or combinations thereof;

providing calibration data related to said TCPB apparatus; and using said calibration data for optically aligning the TCPB apparatus, wherein optically aligning said TCPB apparatus comprises setting one or more parameters chosen from the group of: beam shift, beam tilt, source tilt, source shift, image rotation centre and beam rotation centre, and/or a combination thereof.

9. Method according to claim 8, wherein using said calibration data for optically aligning the TCPB apparatus includes optically aligning TCPB apparatus in absence of a sample on the sample holder.

10. Method according to claim 8, comprising the step of optically aligning the TCPB apparatus by adjusting the illuminator.

11. Method according to claim 8, wherein said calibration data is generated using said TCPB apparatus using a calibration sample.

12. Method according to claim 8, wherein the measure for eucentric height is eucentric focus.

13. Method according to claim 8, further comprises after optically aligning the TCPB apparatus, loading the sample into said TCPB apparatus and imaging or processing the sample with said TCPB apparatus.

* * * * *